United States Patent
Yang et al.

(10) Patent No.: US 10,026,603 B2
(45) Date of Patent: Jul. 17, 2018

(54) MANUFACTURING PROCESS OF WAFER THINNING

(71) Applicant: Phoenix Silicon International Corp., Hsinchu (TW)

(72) Inventors: Shih-Ching Yang, Hsinchu (TW); Chien-Hsiung Huang, Hsinchu (TW); Chao-Tsung Tsou, Hsinchu (TW); Cheng-Yen Lin, Hsinchu (TW)

(73) Assignee: PHOENIX SILICON INTERNATIONAL CORP., Hsinchu (TW)

( * ) Notice: Subject to any disclaimer, the term of this patent is extended or adjusted under 35 U.S.C. 154(b) by 0 days.

(21) Appl. No.: 15/254,343

(22) Filed: Sep. 1, 2016

(65) Prior Publication Data

US 2017/0372885 A1 Dec. 28, 2017

(30) Foreign Application Priority Data

Jun. 28, 2016 (TW) .............................. 105120364 A

(51) Int. Cl.
*H01L 21/02* (2006.01)
*H01L 21/304* (2006.01)
*H01L 21/306* (2006.01)

(52) U.S. Cl.
CPC .. *H01L 21/02013* (2013.01); *H01L 21/02019* (2013.01); *H01L 21/02052* (2013.01); *H01L 21/304* (2013.01); *H01L 21/30604* (2013.01)

(58) Field of Classification Search
CPC ......... H01L 21/02013; H01L 21/02019; H01L 21/02052; H01L 21/304; H01L 21/30604
See application file for complete search history.

(56) References Cited

U.S. PATENT DOCUMENTS

| | | | | |
|---|---|---|---|---|
| 2002/0106518 A1* | 8/2002 | Inaki | ....................... | C03C 17/32 428/421 |
| 2007/0259504 A1* | 11/2007 | Bour | ....................... | C30B 25/02 438/341 |
| 2008/0293221 A1* | 11/2008 | Yamamoto | ........ | H01L 21/67132 438/464 |
| 2009/0020854 A1* | 1/2009 | Feng | ................. | H01L 21/02013 257/619 |
| 2009/0311460 A1* | 12/2009 | Hashii | ..................... | C30B 29/06 428/64.1 |
| 2010/0009519 A1* | 1/2010 | Seddon | ............... | H01L 21/6836 438/464 |
| 2016/0079183 A1* | 3/2016 | Santos Rodriguez | ............................. | H01L 23/522 257/620 |

* cited by examiner

*Primary Examiner* — Anita K Alanko
(74) *Attorney, Agent, or Firm* — WPAT, PC

(57) ABSTRACT

A manufacturing process of wafer thinning includes a step of wafer-grinding to grind a surface of a wafer to a first predetermined thickness, and a step of wafer-etching to etch the grinded face of the wafer with the first predetermined thickness to a second predetermined thickness.

4 Claims, 3 Drawing Sheets

MANUFACTURING PROCESS OF WAFER THINNING

This application claims the benefit of Taiwan Patent Application Serial No. 105120364, filed Jun. 28, 2016, the subject matter of which is incorporated herein by reference.

BACKGROUND OF INVENTION

1. FIELD OF THE INVENTION

The invention relates to a manufacturing process of wafer thinning, and more particularly to the wafer-thinning process that includes both grinding and etching.

2. DESCRIPTION OF THE PRIOR ART

Thinning is the mainstream tendency of the wafer-manufacturing process. Currently, the thinning process usually applies grinding to process the wafer. However, during a wafer-thinning process, problems in cracking wafers and a low yield are usually encountered.

In the art, the technique to resolve the wafer-cracking problem is to place the wafer onto a supportive frame. While the wafer is ground, the supportive frame under the wafer can provide a substantial stable support to the wafer. Since the wafer-cracking problem is usually caused by the internal stress of the wafer during the grinding or etching process, the supportive frame under the wafer can resolve the problem to some degree.

However, empirically, it is found that the usage of the aforesaid supportive frame can only lessen the wafer-cracking problem to some degree. Namely, an unacceptable high possibility of cracking the wafer during the manufacturing process still exists and is yet to be resolved. In addition, due to the price of the supportive frame is comparative high, a hike in the production cost for the wafer manufacturer could be inevitable.

SUMMARY OF THE INVENTION

Accordingly, it is the primary object of the present invention to provide a manufacturing process of wafer thinning that performs a grinding process and an etching process upon the wafer orderly so as to effectively reduce the internal stress of the wafer during the wafer-thinning process without using the supportive frame. Thereupon, the wafer-cracking possibility can be reduced, and the production yield can be raised.

In the present invention, the manufacturing process of wafer thinning includes the step of:

wafer-grinding, grinding a face of a wafer so as to make the wafer to have a first predetermined thickness; and wafer-etching, etching the face of the wafer with the first predetermined thickness so as to make the wafer to have a second predetermined thickness.

By providing the manufacturing process of wafer thinning according to the present invention, a single grinding and etching process upon the wafer is applied. Thereupon, the internal stress of the wafer during the wafer-thinning process can be effectively reduced, the wafer-cracking possibility can be decreased, and also the production yield can be raised.

All these objects are achieved by the manufacturing process of wafer thinning described below.

BRIEF DESCRIPTION OF THE DRAWINGS

The present invention will now be specified with reference to its preferred embodiment illustrated in the drawings, in which.

DESCRIPTION OF THE PREFERRED EMBODIMENT

The invention disclosed herein is directed to a manufacturing process of wafer thinning. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

Figure 1:
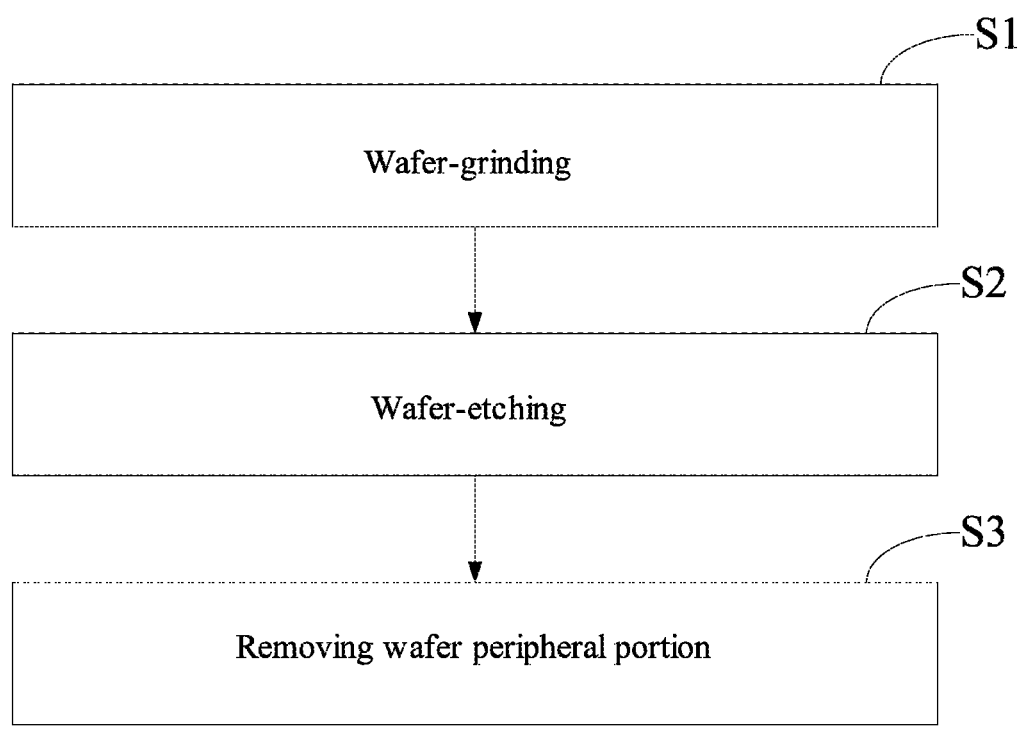
FIG. 1 is a flowchart of a preferred manufacturing process of wafer thinning in accordance with the present invention.

Referring now to FIG. 1, the manufacturing process of wafer thinning includes the following steps.

Step S1: wafer-grinding. A grinding process is only applied to a face of a wafer, in which the grinding is only applied to a central portion of the face of the wafer with a several-mm un-ground margin left at a peripheral portion of this face around the wafer. Such a wafer-grinding process is defined as a TAIKO process. In the TAIKO process, since the thickness of the wafer at the un-ground peripheral portion can be maintained, thus the strength of the wafer can be substantially kept, and thereby possible wafer cracking or distortion after follow-up work or transportation can be substantially reduced.

Alternatively, the wafer can be adhered to a wafer ring. While in grinding the wafer adhered to the wafer ring, the wafer is ground to have a first predetermined thickness, or the central portion of the wafer is ground to the first predetermined thickness. After the thickness requirement is met, the wafer-grinding process is stopped.

Figure 2:
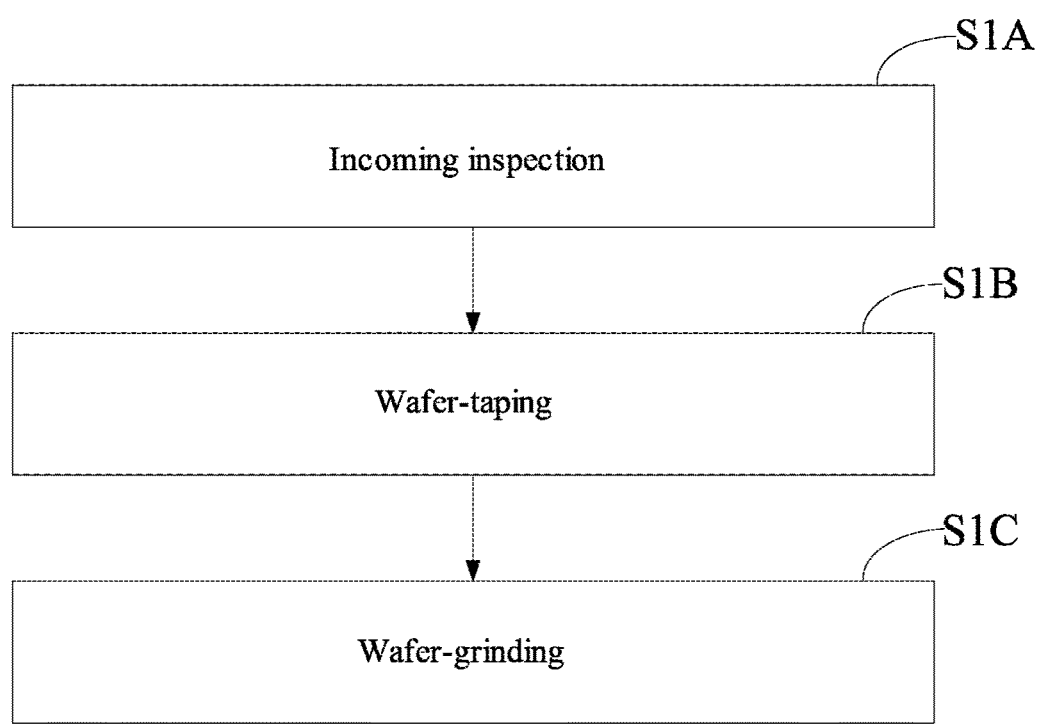
FIG. 2 is a flowchart of a typical TAIKO process in accordance with the present invention.

Referring now to FIG. 2, a typical TAIKO process can have the following steps.

Step S1A: Perform incoming inspection. Perform an inspection process upon the wafer prior to a wafer-grinding process.

Step S1B: Perform a wafer-taping process. Adhere a film onto the wafer to be ground.

Step S1C: Perform a wafer-grinding process. Perform the wafer-grinding process upon a face of the wafer that does not have the film, till the wafer achieves the first predetermined thickness. During the grinding, a several-mm un-ground margin at the peripheral portion around the wafer is kept.

Step S2: Perform a wafer-etching process. Perform the wet etching process upon the ground face of the wafer whose thickness has achieved the first predetermined thickness so as to etch the wafer to have a second predetermined thickness.

Figure 3:
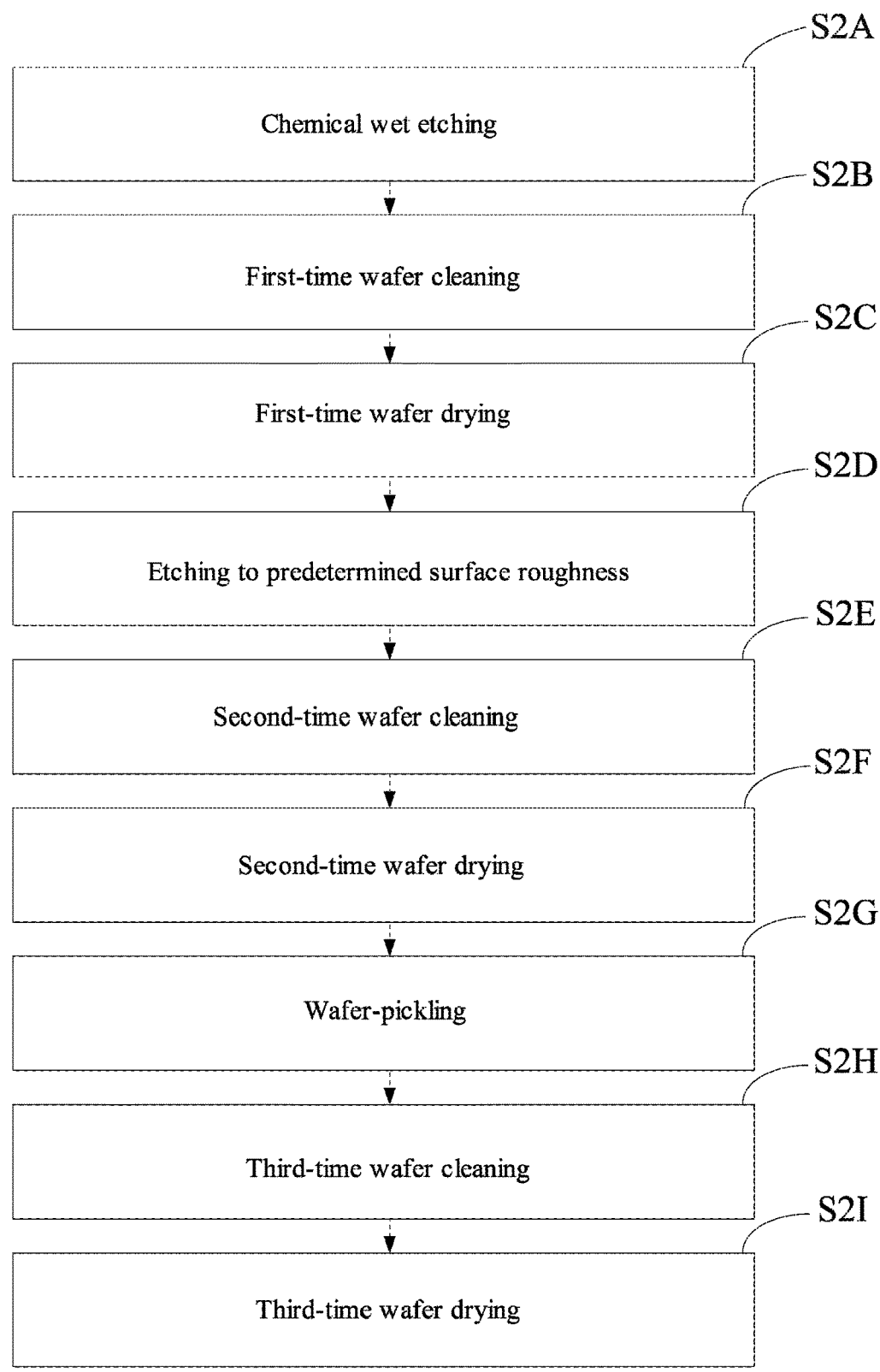
FIG. 3 is a flowchart of a wet etching process in accordance with the present invention.

Referring now to FIG. 3, the aforesaid wet etching can have the following steps.

Step S2A: Perform a chemical wet etching process. Use an etching solution to wet-etch the ground face of the wafer that has been ground to the first predetermined thickness, so as to further reduce the thickness of the wafer to the second predetermined thickness. In the present invention, the second predetermined thickness is within 10~700±4 μm.

Step S2B: Perform a first-time wafer cleaning process. In this step, a horizontal deionized water (DIW) rinsing is applied to clean the wafer horizontally.

Step S2C: Perform a first-time wafer drying process. In this step, a spin drying at a predetermined rotational speed is applied to dry the wafer. In the present invention, the predetermined rotational speed is within 500~1500 rpm, preferably to be one of 550, 600, 650, 700, 750, 800, 850, 900 and 950 rpm.

Step S2D: Perform an etching process to predetermined surface roughness. Perform another wet etching process upon the wafer so as to increase the surface roughness on the etched face of the wafer, particularly with the thickness of the wafer kept at the second predetermined thickness.

Step S2E: Perform a second-time wafer cleaning process. In this step, another DIW Rinsing is applied to clean the wafer.

Step S2F: Perform a second-time wafer drying process. In this step, another spin drying is applied to dry the wafer.

Step S2G: Perform a wafer-pickling process. In this step, an acidic cleaner is introduced to clean the wafer. Particularly, the acidic cleaner can be a dilute hydrofluoric (DHF) acid.

Step S2H: Perform a third-time wafer cleaning process. In this step, a further DIW rinsing is applied to clean the wafer.

Step S2I: Perform a third-time wafer drying process. In this step, a further spin drying at the aforesaid predetermined rotational speed is applied to dry the wafer.

Step S3: Remove the peripheral portion of the wafer. In the case that the wafer is the ground wafer after experiencing the TAIKO process of Step S1, then, in this step, apply a laser to remove or cut off the peripheral portion of the wafer.

In summary, by applying the manufacturing process of wafer thinning according to the present invention, a single grinding and etching process upon the wafer is applied. Thereupon, the internal stress of the wafer during the wafer-thinning process can be effectively reduced, the wafer-cracking possibility can be decreased, and also the production yield can be raised.

While the present invention has been particularly shown and described with reference to a preferred embodiment, it will be understood by those skilled in the art that various changes in form and detail may be without departing from the spirit and scope of the present invention.

What is claimed is:

1. A manufacturing process of wafer thinning, comprising the steps of:
    A) grinding one of the two faces of a wafer so as to make the wafer to have a first predetermined thickness;
        wherein A) includes following steps:
        1) a step to inspect the wafer prior to the wafer-grinding;
        2) a step of a wafer-taping process to adhere a film onto a first face of the wafer; and
        3) a step to grind a second face of the wafer that does not have the film till the wafer achieves the first predetermined thickness, grinding is only applied to a central portion of the second face of the wafer with a several mm un-ground margin at a peripheral portion around the wafer; and
    B) etching the second face of the wafer so as to make the wafer to have a second predetermined thickness;
        wherein the wafer etching B) includes following steps:
        1) a step of a chemical wet etching process to apply an etching solution to wet-etch the second face of the wafer so as to further reduce a thickness of the wafer to the second predetermined thickness;
        2) a step of a first-time wafer cleaning process to clean the wafer;
        3) a step of a first-time wafer drying process to dry the wafer;
        4) a step of an etching process to achieve predetermined surface roughness so as to increase surface roughness of the second face of the wafer;
        5) a step of a second-time wafer cleaning process to clean the wafer; and
        6) a step of a second-time wafer drying process to dry the wafer;
        7) a step of a wafer-pickling process to clean the wafer using an acidic cleaner;
        8) a step of a third-time wafer cleaning process to clean the wafer; and
        9) a step of a third-time wafer drying process to dry the wafer;
        wherein the acidic cleaner is a dilute hydrofluoric acid, all of the first-time wafer cleaning process, the second-time wafer cleaning process and the third-time wafer cleaning process are horizontal deionized water rinsing processes, and all of the first-time wafer drying process, the second-time wafer drying process and the third-time wafer drying process are spin-drying processes; and
        wherein the manufacturing process of wafer thinning follows a sequence of the above alphabetic order and the above numeric order.

2. The manufacturing process of wafer thinning of claim 1, wherein, in the step of wafer-grinding, the wafer is adhered onto a wafer ring.

3. The manufacturing process of wafer thinning of claim 2, further including a step of removing the several-mm un-ground margin left at the peripheral portion of the wafer.

4. The manufacturing process of wafer thinning of claim 1, wherein a laser is applied to remove the several-mm un-ground margin left at the peripheral portion of the wafer.

* * * * *